(12) United States Patent
Kim

(10) Patent No.: US 6,587,915 B1
(45) Date of Patent: Jul. 1, 2003

(54) FLASH MEMORY HAVING DATA BLOCKS, SPARE BLOCKS, A MAP BLOCK AND A HEADER BLOCK AND A METHOD FOR CONTROLLING THE SAME

(75) Inventor: Bum Soo Kim, Seoul (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/671,176

(22) Filed: Sep. 28, 2000

(30) Foreign Application Priority Data

Sep. 29, 1999 (KR) .............................. 99-41835

(51) Int. Cl.[7] .............................................. G11C 16/00
(52) U.S. Cl. ...................... 711/103; 711/206; 711/209; 714/7; 714/8; 365/185.33
(58) Field of Search ................................. 711/103, 206, 711/209; 714/7, 8; 365/185.33

(56) References Cited

U.S. PATENT DOCUMENTS

| | | | | |
|---|---|---|---|---|
| 5,404,485 A | * | 4/1995 | Ban ............................ | 711/202 |
| 5,406,529 A | * | 4/1995 | Asano .................... | 365/185.11 |
| 5,485,595 A | * | 1/1996 | Assar et al. ............ | 365/185.11 |
| 5,630,093 A | * | 5/1997 | Holzhammer et al. ...... | 711/115 |
| 5,717,886 A | * | 2/1998 | Miyauchi ....................... | 707/1 |
| 5,765,175 A | * | 6/1998 | Needham et al. ........... | 707/200 |
| 5,787,445 A | * | 7/1998 | Daberko ..................... | 707/102 |
| 5,835,935 A | * | 11/1998 | Estakhri et al. ......... | 365/185.11 |
| 5,860,082 A | * | 1/1999 | Smith et al. ................. | 711/103 |
| 5,867,641 A | * | 2/1999 | Jenett .......................... | 711/103 |
| 5,896,393 A | * | 4/1999 | Yard et al. .............. | 365/185.09 |
| 5,937,434 A | * | 8/1999 | Hasbun et al. .............. | 711/156 |
| 5,946,714 A | * | 8/1999 | Miyauchi ..................... | 711/103 |
| 5,978,808 A | * | 11/1999 | Wells et al. ................. | 707/100 |
| 6,230,233 B1 | * | 5/2001 | Lofgren et al. .......... | 365/185.3 |
| 6,236,593 B1 | * | 5/2001 | Hong et al. ............ | 365/185.11 |
| 6,260,156 B1 | * | 7/2001 | Garvin et al. ................ | 360/48 |

FOREIGN PATENT DOCUMENTS

WO WO97/12325 * 4/1997 .......... G06F/12/02

* cited by examiner

*Primary Examiner*—Hong Kim
(74) *Attorney, Agent, or Firm*—Sughrue Mion, PLLC (57) ABSTRACT

A flash memory and a method for controlling the same are disclosed. The flash memory has units, each of which includes a plurality of data blocks for writing data; a plurality of spare blocks emptied for writing updated data of the data blocks; a map block for designating an actual location in which data is written; and a header block for recording flash memory information and unit information. The method, in the case of updating data of a data block, first writes update data into an empty spare block in the same unit, updates mapping information of the map block, and updates state information of a previous block, so that a user can have access to data by using the same address and there is no need of deleting a unit every time the block is updated. Therefore, the present invention enhances an efficiency of writing and updating data while reducing the number of delete times.

13 Claims, 10 Drawing Sheets

FIG. 1

FIG.2 address/data bus

LBN-TO-LUN

| LBN | LUN |
|---|---|
| 1 | 1 |
| 2 | 1 |
| 3 | 2 |
| 4 | 2 |
| 5 | 2 |
| 6 | 1 |
| ... | ... |

FIG. 3A

LUN-TO-PUN

| LUN | PUN |
|---|---|
| 1 | 2 |
| 2 | 1 |
| ... | ... |

(a) LBN-to-LUN

| LBN | LUN |
|---|---|
| 1 | 1 |
| 2 | 1 |
| 3 | 2 |
| 4 | 2 |
| 5 | 2 |
| 6 | 1 |
| ... | ... |

(b) LUN-to-PUN

| LUN | PUN |
|---|---|
| 1 | 2 |
| 2 | 1 |
| ... | ... |

(c) PUN1

(d) PUN2

LBN-TO-LUN

| LBN | PBN |
|---|---|
| 1 | 1 |
| 2 | 1 |
| 3 | 2 |
| 4 | 2 |
| 5 | 2 |
| 6 | 1 |
| ... | ... |

FIG. 13A

LUN-TO-PUN

| LUN | PUN |
|---|---|
| 1 | 2 |
| 2 | 3 |
| ... | ... |

FIG. 13B

PUN1

| | EUH | | | |
|---|---|---|---|---|
| BAM | 3 | 4 | 5 | 3 |
| 1 | | 3 | | |
| 2 | 4 | | | |
| 3 | 5 | | | |
| 4 | 3 | | | |

FIG. 13C

PUN3

| | EUH | | | |
|---|---|---|---|---|
| BAM | 3 | 4 | 5 | |
| 1 | 3 | | | |
| 2 | 4 | | | |
| 3 | 5 | | | |
| 4 | /// | | | |

FIG. 13D

PUN2

| | EUH | | | |
|---|---|---|---|---|
| BAM | 1 | 2 | 6 | |
| 5 | 1 | | | |
| 6 | 2 | | | |
| 7 | 6 | | | |
| 8 | /// | | | |

FIG. 13E

FLASH MEMORY HAVING DATA BLOCKS, SPARE BLOCKS, A MAP BLOCK AND A HEADER BLOCK AND A METHOD FOR CONTROLLING THE SAME

BACKGROUND OF THE PRESENT INVENTION

1. Field of the Invention

The present invention relates to a flash memory and a method for controlling the same, and more particularly to a flash memory and a method for controlling the same, enabling the writing and reading of data by the block unit while efficiently managing the mapping between logic and physical addresses of a block.

This application is based on Korean Application No. KPA 1999-41835, which is incorporated herein for all purposes.

2. Description of the Prior Art

A flash memory developed by the INTEL corporation co., Ltd. for the first time in the early 1980s is a kind of the EPROM, but different from the general EPROM in that the flash memory does not need separate hardware for a program and data in the flash memory can be deleted and written with software.

Due to the volatile and programmable characteristics of the flash memory, the flash memory is widely used in a built-in type system such as a mobile phone or other mobile devices like a personal digital assistant (PDA).

The flash memory allows an arbitrary access to data stored at a particular location like the existing RAM or other volatile storage devices, magnetic discs, and the like, but uses a different method for correcting and deleting data.

That is, in the case of deleting data written in a certain block of an initialized flash memory, an entire unit in which the block is included is deleted.

Here, bytes having physically consecutive addresses are referred to as a block which is used as a basic unit for operations with respect to the flash memory. Further, a unit constituted with plural blocks in the flash memory is physically deleted at one time as a basic unit for a delete operation.

Accordingly, data is mainly accessed by the block unit in the flash memory as in a disc, rather than reading and writing data by the byte unit as in the RAM.

Software that enables the flash memory to be used as a block device is generally referred to as a flash translation layer (FTL).

TrueFFS [FTL97] of the M-system company and FlashFX [FX99] of the Datalight company may be referred to as the typical FTL products.

Particularly, a component, out of various components of the above software, for supporting a block re-mapping is referred to as FTL in the TrueFFS [FX99] and as VBX in the FlashFX, and the FTL of the M-System company is selected as a PC Card standard storing format.

In the case in which the flash memory is accessed by the block unit, the flash memory is divided into blocks each having a certain size smaller than a unit.

A number sequentially assigned to a divided block is referred to as a physical block number (PBN), and an imaginary number of a divided block which a user has in mind is referred to as a logical block number (LBN).

A method for providing a mapping between the logical block number (LBN) and the physical block number (PBN) is mainly classified into a fixed mapping and an arbitrary mapping.

A. Fixed Mapping

The fixed mapping is a method for fixedly defining a relation between the logical block number (LBN) and the physical block number (PBN).

In a very simple case in which a separate header is not used, the relation may be indicated as LBN=PBN.

Figure 1:
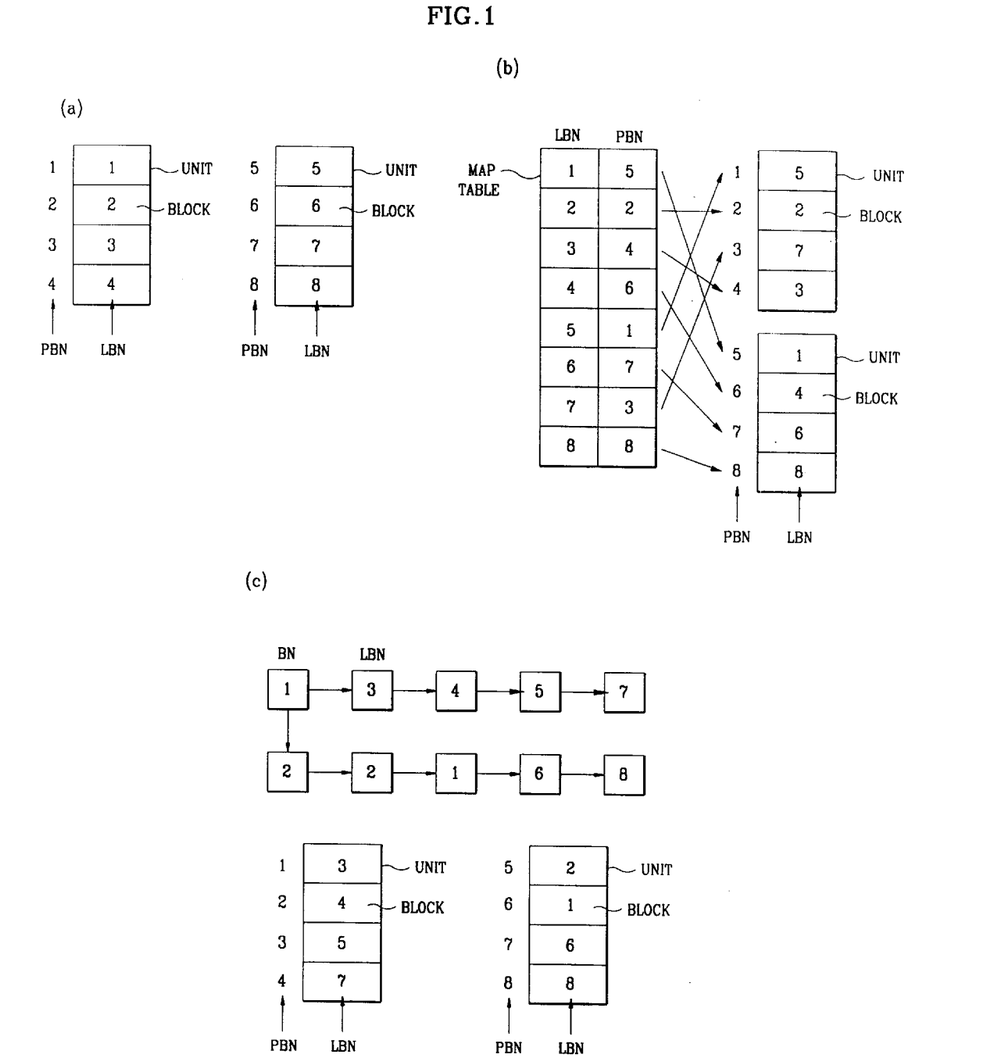
FIG. 1(A) is a view for explaining a general fixed mapping.
FIG. 1(B) is a view for explaining a general arbitrary mapping.
FIG. 1(C) is a view for explaining a mixed mapping according to an embodiment of the present invention.
Figure 2:
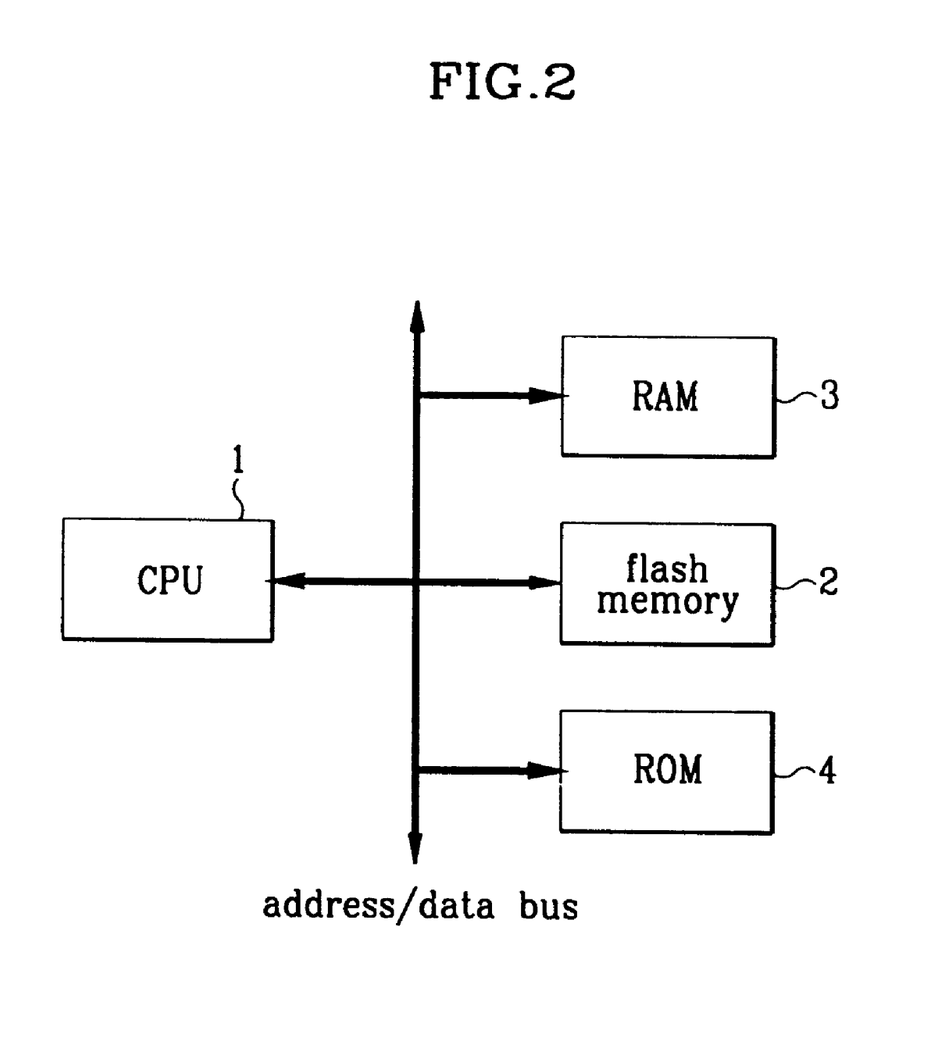
FIG. 2 is a block diagram for showing peripheral circuits together with a general flash memory.

FIG. 1(A) is a view for explaining a general fixed mapping, and FIG. 2 is a block diagram for showing peripheral circuits together with a general flash memory. As shown in FIG. 1(A) and FIG. 2, if data written in block 2 of a unit of a flash memory 2 is to be updated, data of blocks 1, 3, and 4 are first read to be written in a RAM 3, all the data of a unit to which the blocks 1, 2, 3, and 4 belong are deleted, the data of the blocks 1, 3, and 4 written in the RAM 3 are read to be again written in the blocks 1, 3, and 4, and new data is written in the block 2.

Accordingly, it takes a long time to delete and re-write block data. Furthermore, data in the blocks 1, 2, 3, and 4 may be completely lost if a failure occurs just after deleting block data.

That is, the fixed mapping has an advantage that it does not need storage space and an algorithm for maintaining complicated mapping information, and a code size is small. However, fixed mapping has a disadvantage in that performance of a delete operation or an update operation is not good.

B. Arbitrary Mapping

The arbitrary mapping is mainly used in the existing FTL products, and is characterized in that a relation between the logical block number (LBN) and the physical block number (PBN) is not fixedly defined.

That is, an arbitrary logical block is allocated to an empty physical block, so that the relation may be indicated as MAP (LBN)=PBN.

Mapping information between a logical unit number (LUN) and a physical unit number (PUN) is stored in the RAM 3 and a flash memory 2 together with mapping information between the logical block number (LBN) and the physical block number (PBN).

The mapping information between the physical unit number (PUN) and the logical unit number (LUN) is written in a map table in the RAM 3 to be used in transforming a logical address to a physical address, so that, if a mapping relation is changed due to a delete operation, an update operation, or a retrieve operation, the map table is also updated to continuously allow an access to the logical address.

FIG. 1(B) is a view for explaining a general arbitrary mapping. As shown in FIG. 1(B), in the case in which a central processing unit 1 performs a read operation, the logical block number (LBN) requested by a user is transformed into the physical block number (PBN) through the map table.

As for a write operation, like the read operation described above, the logical block number (LBN) is first transformed into the physical block number (PBN) for an access to a corresponding block. At this time, if data is written in the corresponding block in advance, data of a unit to which the block belongs is completely deleted due to the property of the flash memory, data of a block not to be updated and data of a block to be updated are re-written in the deleted unit or in a new unit, and then the previous unit is indicated to be deleted.

At this time, the physical block number (PBN) with respect to the logical block number (LBN) is updated in the map table.

Further, since a rate of using a memory becomes low if many blocks are not used in a unit, only used blocks are moved to a different unit, wherein a logical number is assigned to the unit and then transformed into a physical block so that access to the same logical unit number (LUN) can be performed even though data of a unit is moved.

As stated above, a conventional arbitrary mapping method used for a flash memory writes and reads data in and from the flash memory using a map table.

Accordingly, the conventional arbitrary method used for the flash memory has drawbacks in that it needs a separate storage space for maintaining mapping information required to transform a logical address to an arbitrary physical address, requires a long time for writing or updating data, and has difficulties in embodying or implementing a complicated mapping structure or an algorithm with errors.

SUMMARY OF THE INVENTION

Accordingly, in order to solve the problem, it is an object of the present invention to provide a flash memory and a method for controlling the same, enabling the writing and reading of data by the block unit while efficiently managing the mapping between logical and physical addresses of a block.

In order to achieve the above object, a flash memory according to the present invention comprises units, each of which includes a plurality of data blocks for writing data; a plurality of spare blocks emptied for writing updated data of the data blocks; a map block for designating an actual location in which data is written; and a header block for recording flash memory information and unit information.

Further, in order to achieve the above object, in a flash memory having units, each of which includes a plurality of data blocks for writing data, a plurality of spare blocks emptied for writing updated data of the data blocks, a map block for designating an actual location in which data is written, and a header block for recording flash memory information and unit information, the method for controlling the flash memory according to the present invention comprises steps of searching a logical unit to which a logical block belongs; searching a physical unit with respect to the logical unit; and searching a physical block location with respect to the logical block in the map block of the physical unit, to thereby control a mapping operation.

Accordingly, the present invention, in the case of updating data of a data block, first writes update data into an empty spare block in the same unit, updates mapping information of the map block, and updates state information of a previous block, so that a user can have access to data by using the same address and there is no need of deleting a unit every time the block is updated. Therefore, the present invention enhances an efficiency of writing and updating data by reducing the number of delete times.

BRIEF DESCRIPTION OF THE DRAWINGS

The above objects and other advantages of the present invention will become more apparent by describing in detail a preferred embodiment thereof with reference to the attached drawings, in which.

DETAILED DESCRIPTION OF THE PREFERRED EMBODIMENT

Hereinafter, a flash memory and a method for controlling the same according to an embodiment of the present invention will be described in detail with reference to the accompanying drawings.

Figure 3A:
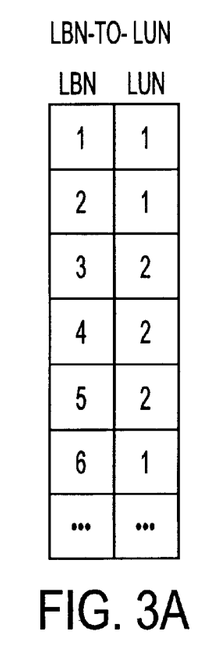
FIGS. 3(A)–(D) are a set of views for explaining a flash memory and a method for controlling the same according to an embodiment of the present invention, wherein (A) is a view for showing an LBN-to-LUN map table structure, (B) is a view for showing an LUN-to-PUN map table structure, (C) and (D) are views for showing a structure of units in a flash memory.
Figure 3B:
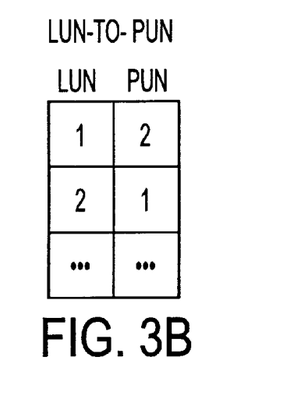
Figure 3C:
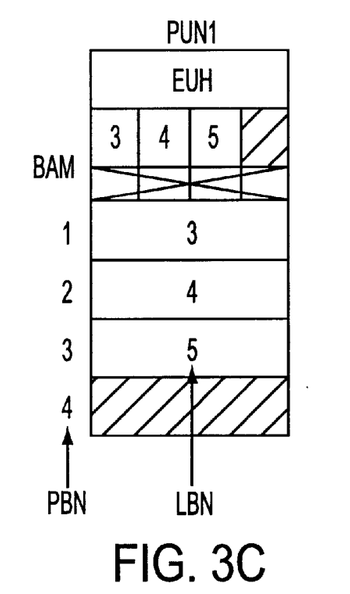
Figure 3D:
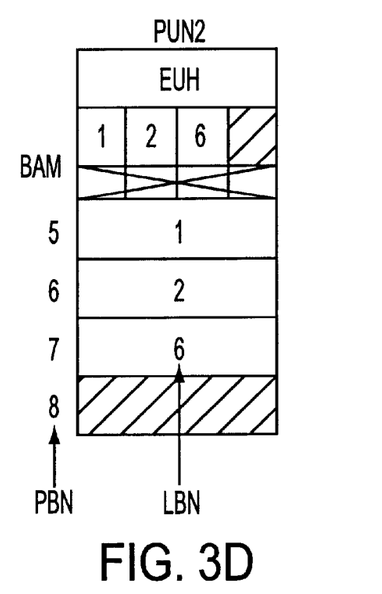

FIGS. 3(C) and (D) are views for showing a structure of units in a flash memory according to an embodiment of the present invention.

As shown in FIGS. 3(C) and (D), in the flash memory having units according to an embodiment of the present invention, each unit includes plural data blocks for writing data; plural spare blocks emptied for writing updated data of the data blocks; a map block BAM for designating an actual location in which data is written; and a header block EUH for recording flash memory information and unit information.

Here, the unit is used as a basic unit of a delete operation. Written in the header blocks are a logical unit number (LUN), a wear and tear degree, and block size information, and written in the map block are a logical block number (LBN), block state information, and updated block location information.

Figure 4:
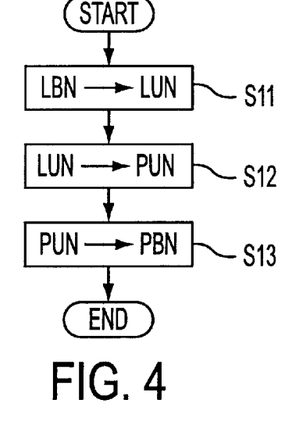
FIG. 4 is a flow chart for showing mapping operations controlled by a method of FIG. 3.

FIG. 4 is a flow chart for showing mapping operations controlled by a method for controlling a flash memory according to an embodiment of the present invention.

As shown in FIG. 4, in a flash memory according to an embodiment of the present invention, a method according to an embodiment of the present invention includes steps of: searching a logical unit to which a logical block belongs (S11); searching a physical unit with respect to the logical unit (S12); and searching a physical block location with respect to the logical block in the map block of the physical unit (S13), to thereby control mapping operations.

Figure 5:
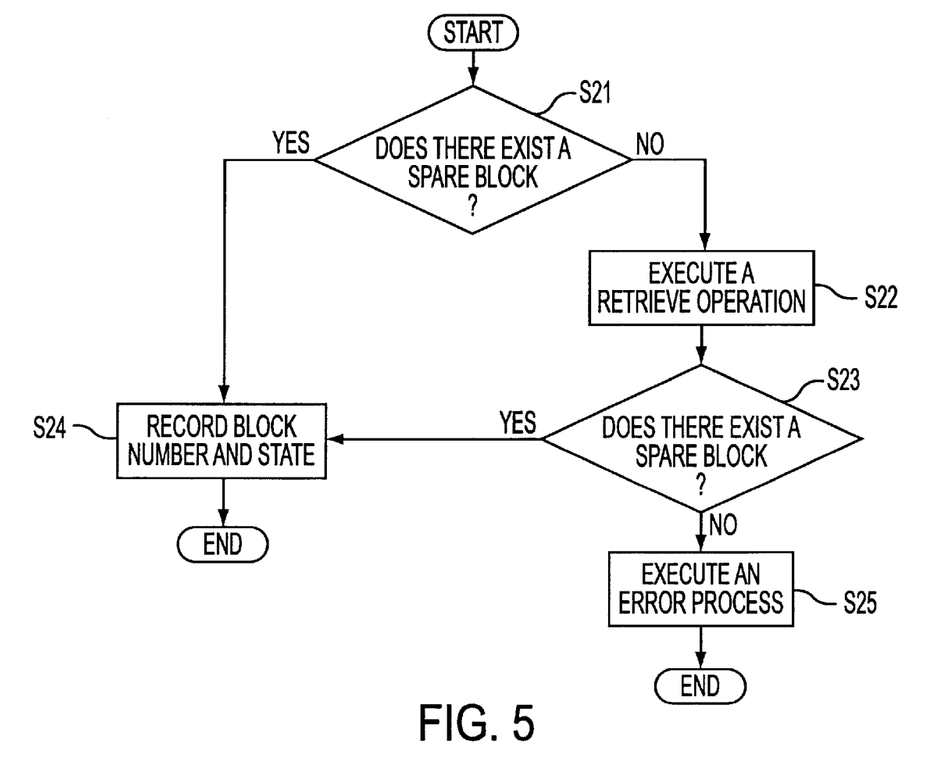
FIG. 5 is a flow chart for showing block allocation operations controlled by a method of FIG. 3.

FIG. 5 is a flow chart for showing block allocation operations controlled by a method for controlling a flash memory according to an embodiment of the present invention.

As shown in FIG. 5, a method according to an embodiment of the present invention includes steps of: checking a map block of the unit to judge if there is a spare block in the unit (S21); performing a retrieve operation with respect to the unit if there is no spare block in the unit as the judgement result in the step S21 (S22); checking a map block of the retrieved unit to judge if there is a spare block in the retrieved unit (S23); writing a logical block number (LBN) and a state of a data block into the map block if the spare block exists in the unit as the judgement result in the step S21 or if the spare block exists in the retrieved unit as the judgement result in the step S23 (S24); and performing an error process if there is no spare block in the retrieved unit as the judgement result in the step S23, to thereby control an allocation operation.

Figure 6:
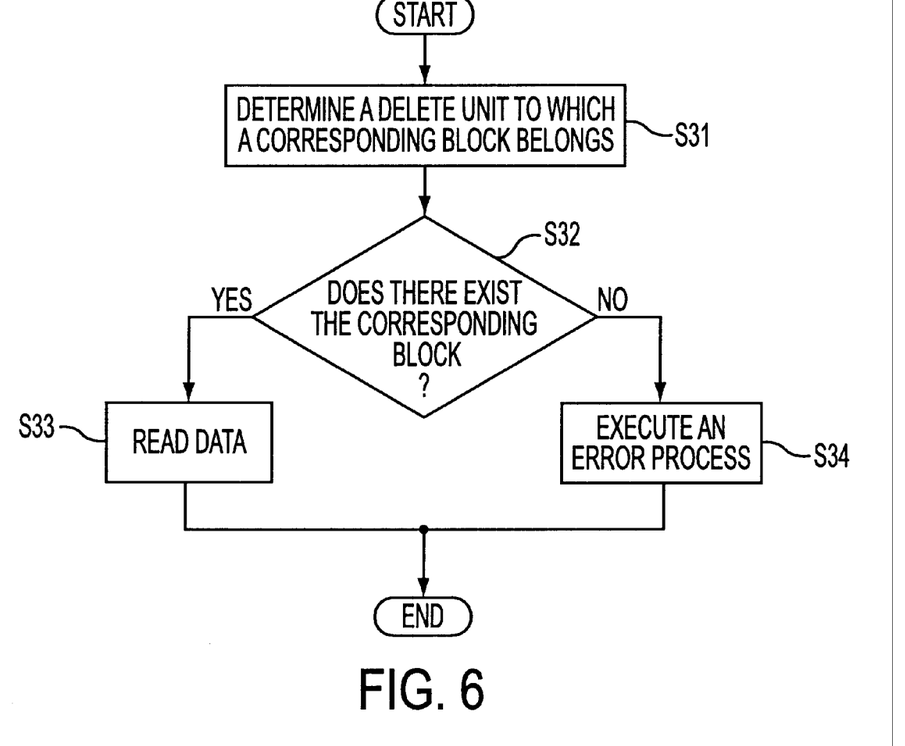
FIG. 6 is a flow chart for showing a read operation controlled by a method of FIG. 3.

FIG. 6 is a flow chart for showing a read operation controlled by a method for controlling a flash memory according to an embodiment of the present invention.

As shown in FIG. 6, the method according to the present invention includes steps of: searching a unit to which a corresponding data block belongs (S31); judging if the corresponding data block exists in the unit (S32); reading data in the corresponding data block if the corresponding data block exists as the judgement result in step S32 (S33); and carrying out an error process if the corresponding data block does not exist as the judgement result in step S32 (S34), to thereby control a read operation.

Figure 7:
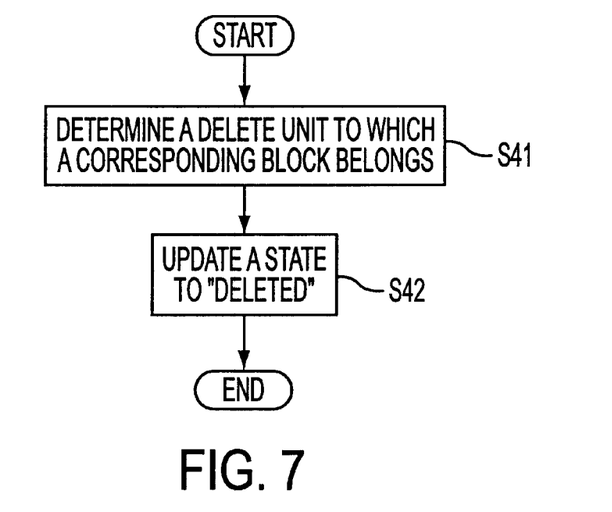
FIG. 7 is a flow chart for showing a delete operation controlled by a method of FIG. 3.

FIG. 7 is a flow chart for showing a delete operation controlled by a method for controlling a flash memory according to an embodiment of the present invention.

As shown in FIG. 7, the method according to an embodiment of the present invention includes steps of: searching a unit to which a corresponding data block belongs (S41); and updating a state of the corresponding data block written in a map block of the unit (S42), to thereby control a delete operation.

Figure 8:
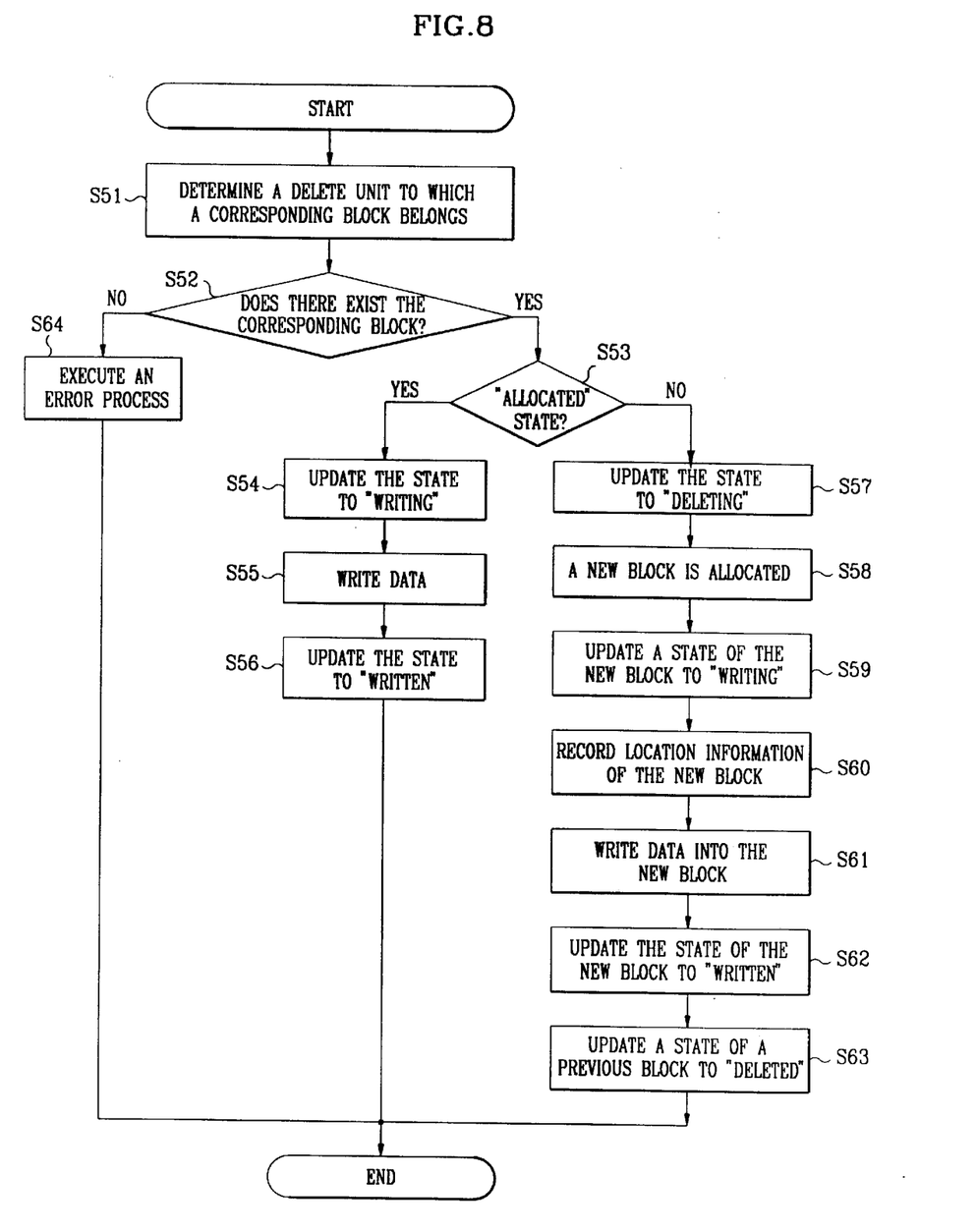
FIG. 8 is a flow chart for showing an update operation controlled by a method of FIG. 3.

FIG. 8 is a flow chart for showing an update operation controlled by a method for controlling a flash memory according to an embodiment of the present invention.

As shown in FIG. 8, the method according to an embodiment of the present invention includes steps of: determining a unit to which a corresponding data block belongs (S51); judging if the corresponding data block exists in the unit (S52); searching a map block and judging if a state of the corresponding data block is "allocated" if the corresponding data block exists as the judgement result in step S52 (S53); updating the state of the corresponding data block to "writing" if the corresponding data block is "allocated" as the judgement result in step S53 (S54); storing data in the corresponding data block (S55); updating the state of the corresponding data block to "written" (S56); updating the corresponding data block to "deleting" if the corresponding data block is not "allocated" as the judgement result in step S53 (S57); searching a spare block in the unit to be allocated (S58); updating a state of a newly allocated block to "writing" (S59); storing position information of the newly allocated block in the map block (S60); storing data in the newly allocated block (S61); updating the state of the newly allocated block to "written" (S62); updating the state of the corresponding data block to "deleted" (S63); and carrying out an error process if the corresponding data block does not exist as the judgement result in step S52 (S64), to thereby control an update operation.

Figure 9:
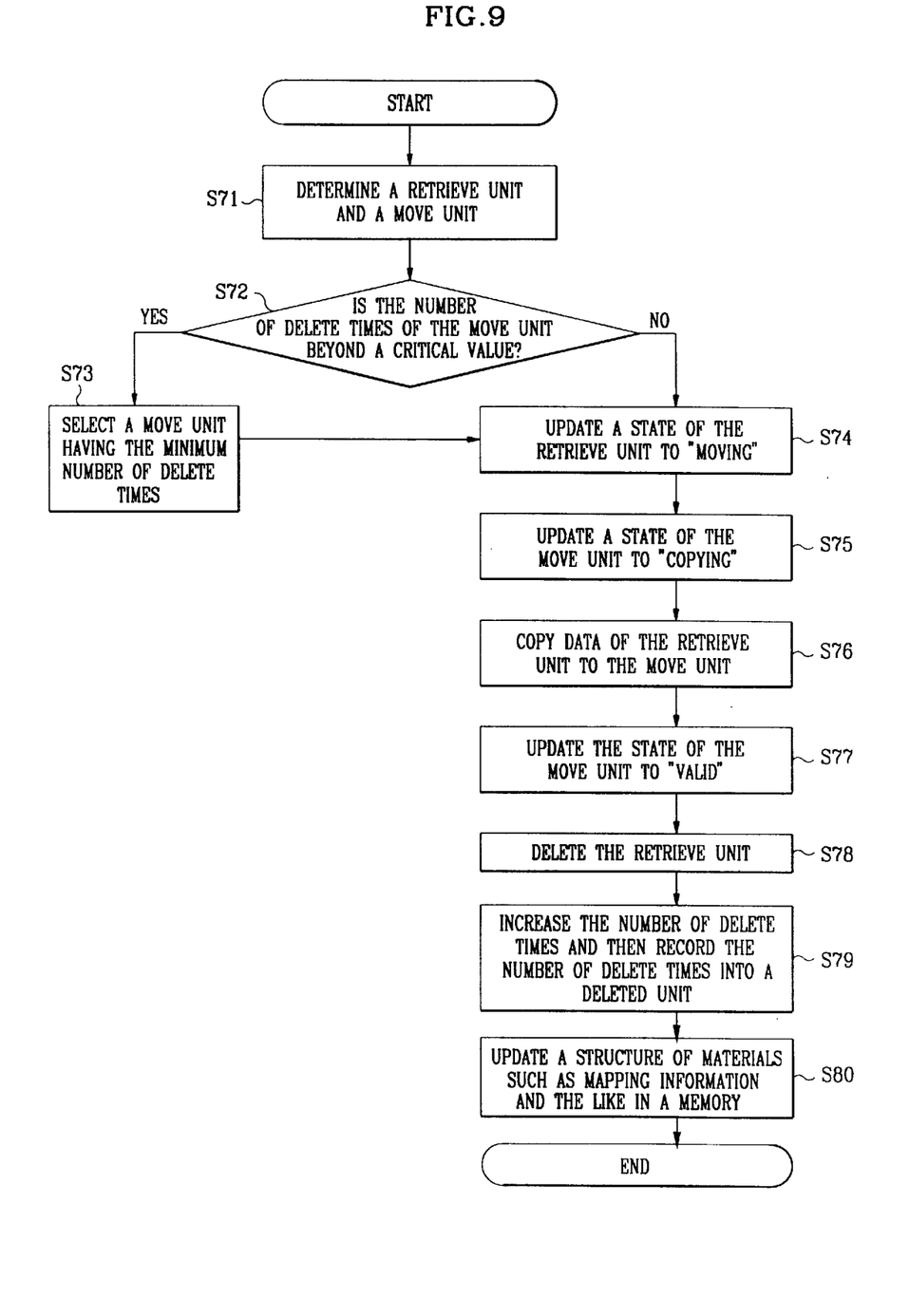
FIG. 9 is a flow chart for showing a retrieve operation controlled by a method of FIG. 3.

FIG. 9 is a flow chart for showing a retrieve operation controlled by a method for controlling a flash memory according to an embodiment of the present invention.

As shown in FIG. 9, the method according to an embodiment of the present invention includes steps of: determining a retrieve unit (EU) and a move unit (TU)(S71); judging if the number of delete times of the move unit (TU) is beyond a critical value (S72); selecting a move unit of the minimum number of delete times if the number of delete times of the move unit (TU) is beyond the critical value as the judgement result in step S72 (S73); updating a state of the retrieve unit (EU) to "moving" if a move unit (TU) having the number of delete times not greater than the critical value as the judgement result in step S72 or having the minimum number of delete times in step S73 is selected (S74); updating a state of the move unit (TU) having the number of delete times not beyond the critical value or having the minimum number of delete times in the step S74 to "copying" (S75); copying blocks and map block items in the states of "writing" and "written" and the number of delete times from the retrieve unit (EU) into the move unit (TU)(S76); updating a state of the move unit (TU) to "valid" (S77); deleting the retrieve unit (EU)(S78); reading and increasing the number of delete times of the retrieve unit copied into the move unit (TU) and then writing the number of delete times into the retrieve unit which are now deleted (S79); and updating a structure of materials such as mapping information and the like inside a flash memory (S80), to thereby control a retrieve operation.

Figure 10:
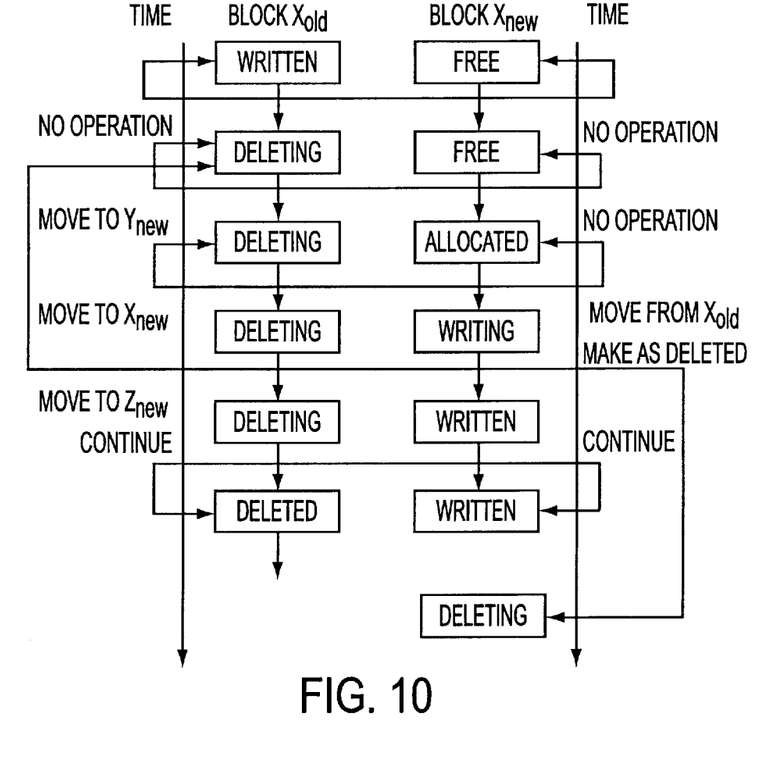
FIG. 10 is a view for showing a state of a restore operation controlled by a method of FIG. 3 when an error occurs while performing an update operation of FIG. 8.

FIG. 10 is a view for showing a state of a restore operation controlled by a method of FIG. 3 when an error occurs while performing an update operation shown in FIG. 8.

As shown in FIG. 10, while deleting data of a data block X_old, a) if an error occurs in a state that a spare block X_new is not allocated, the method according to an embodiment of the present invention allocates a spare block Y_new in the same unit and writes the deleting data to the allocated spare block Y_new from the data block X_old, b)if an error occurs in a state that a spare block X_new is allocated, the method according to an embodiment of the present invention writes the deleting data to the allocated spare block X_new from the data block X_old, and c) if an error occurs in a state that updated data is being written to the spare block X_new, the method according to an embodiment of the present invention deletes the updated data written in the spare block X_new, reallocates a spare block Z_new in the same unit, and writes the deleting data to the reallocated spare block Z_new from the data block X_old, to thereby control a restore operation when an error occurs.

Figure 11:
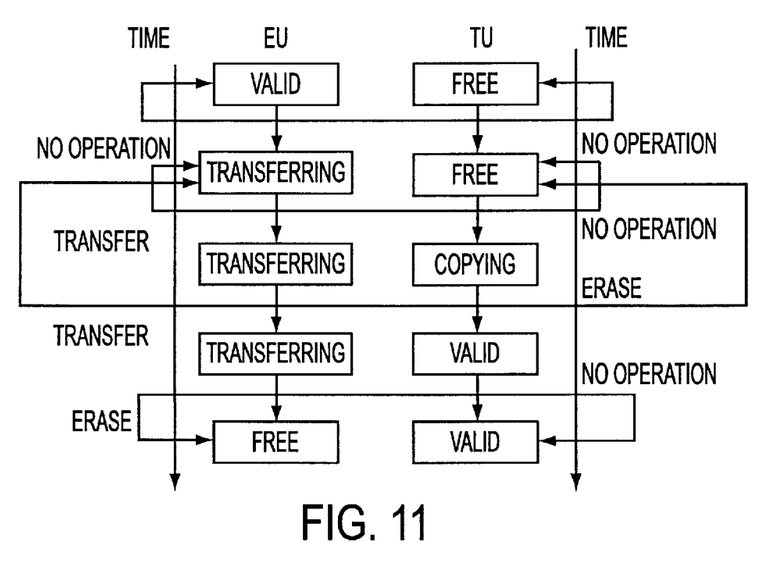
FIG. 11 is a view for showing a state of a restore operation controlled by a method of FIG. 3 when an error occurs while performing a retrieve operation of FIG. 9.

FIG. 11 is a view for showing a state of a restore operation controlled by a method of FIG. 3 when an error occurs while performing a retrieve operation shown in FIG. 9.

As shown in FIG. 11, while transferring data of a retrieve unit (EU), a) if an error occurs in a state that the data is being copied to a move unit (TU), the method according to an embodiment of the present invention re-executes a retrieve operation of the retrieve unit (EU), and b) if an error occurs in a state that the data is not being copied to the move unit (TU), the method according to an embodiment of the present invention deletes the copied data to the move unit (TU) and re-executes the retrieve operation of the retrieve unit (EU), to thereby control a restore operation when an error occurs.

Operations and effects of the embodiment according to the present invention having a structure as stated above will now be described in detail, with reference to FIG. 2, as for a flash memory unit structure, a mapping operation, a block allocation operation, a read operation, a delete operation, an update operation, a retrieve operation, and a restore operation when an error occurs.

FIG. 2 is a block diagram for showing peripheral circuits together with a general flash memory applied to an embodiment of the present invention.

A. Flash Memory Unit Structure

A flash memory unit according to a method of the present invention has a structure generally similar to FTL, DMS, etc. However, a mapping method different from them is employed, so that a store structure and an algorithm suitable for the mapping method are used.

In general, a flash memory is constituted with a plurality of units, each of which has a plurality of blocks.

Each unit is provided with a physical unit number (PUN) and a logical unit number (LUN), wherein the physical unit number (PUN) is assigned according to a physical order of the unit and the logical unit number (LUN) is a number indicating a logical order of the unit.

Further, each block is provided with a physical block number (PBN) and a logical block number (LBN), wherein the physical block number (PBN) is assigned according to a physical order of a block and the logical block number (LBN) is a number indicating a logical order of a block.

FIG. 3 is a set of views for explaining a flash memory and a method for controlling the same according to an embodiment of the present invention, wherein (A) is a view for showing an LBN-to-LUN map table structure, (B) is a view for showing an LUN-to-PUN map table structure, (C) and (D) are views for showing a structure of units in a flash memory.

As shown in FIG. 3, (C) and (D) written into a first block of a unit are information on the entire flash memory (for example, block size information) and information necessary for a unit management (for example, a logical unit number (LUN), a wear and tear degree). The first block is referred to as a header (EUH: eraser unit header) block.

A second block in a unit is a map (BAM: block allocation map) block in which information (for example, a logical block number (LBN), block state information, location information of an updated block, and so on) is written with respect to blocks belonging to the unit.

The logical block number (LBN) is a block address a user has in mind. Accordingly, the map block indicates a mapping between the logical block number (LBN) and a physical block number (PNB) in which a block is actually written. If block data is updated, state information for a corresponding item in the map block is changed to be written with a location in which the updated block is stored. Following the value enables a final location of the block to be ascertained.

At this time, in order to control a flash memory 2 more effectively, the map block of each unit is partially or entirely copied into a storage device such as a RAM 3, so that a final location may be instantly grasped without following the changed location information.

At this time, the number of blocks allocatable to a unit should be maintained to be less than the maximum number of blocks recordable to the unit.

For example, as shown in FIG. 3 (C) and (D), if there are six blocks in a unit, the blocks are divided, when used, into one header block, one map block, three data blocks, and one spare block, so that the spare block may be used when the data blocks are updated or rewritten after being deleted.

B. Mapping Operation

A mapping operation controlled according to a method of the present invention is performed with a kind of mixed mapping which combines the fixed mapping and the arbitrary mapping.

As shown in FIG. 1(A), the mixed mapping allocates a logical block number (LBN) to a particular logical unit number (LUN) and then arbitrarily allocates the logical block number (LBN) in a logical unit. The method of allocating a logical block number (LBN) to a logical unit number is similar to a method of allocating a key value to a bucket by using the hash function, that is, "Search (Hash (LBN))=PBN".

FIG. 4 is a flow chart for showing mapping operations controlled by a method for controlling a flash memory according to an embodiment of the present invention, which will be described with reference to FIG. 1(C), FIG. 3, and FIG. 4.

First of all, if a central processing unit 1 accesses a block of a flash memory 2 so as to execute an operation, the central processing unit 1 searches a logical unit number (LUN) to which the block belongs (S11). At this time, in order to search for a logical unit number to which a logical block number belongs, an LBN-to-LUN map table as shown in FIG. 3(A) may be used.

After the central processing unit 1 determines the logical unit number (LUN), an "LUN-to-PUN" map table as shown in FIG. 3(B) is used to determine a physical unit with respect to a logical unit (S12).

Further, the central processing unit 1 searches a location of a physical block with respect to a logical block in the map block of the physical unit as shown in FIG. 3(C) and (D) (S13).

The "LBN-to-PUN" map table and the "LUN-to-PUN" map table are located in a RAM 3. If a mapping relation is changed due to a delete operation, an update operation, or a retrieve operation, the map tables are updated in order for the central processing unit 1 to enable access to continue to an identical logical address.

Such mixed mapping does not fixedly map a logical block to a physical block as in the fixed mapping, nor does it require space and time for maintaining complicated mapping information as in the arbitrary mapping, nor does it generate frequent delete operations in the case in which blocks belonging to a unit are intensively updated, so as to enhance an efficiency for writing and updating data.

Units differing in size may be used in a double bank flash memory 2. Since, in this case, a unit size is different from each other, in order for such asymmetrically structured flash memory to be supported in a mapping operation of the present invention using a unit as a bucket to which a logical block is allocated, a mapping method should be provided to efficiently use buckets different in size from each other. As shown in FIG. 1(C), a logical block number (LBN) is mapped into a bucket number (BN)(LBN-to-BN) while the bucket number (BN) is mapped to a logical unit number (LUN)(BN-to-LUN), to thereby process a unit as if size-different buckets are used.

C. Block Allocation Operation

FIG. 5 is a flow chart for showing block allocation operations controlled by a method for controlling a flash memory according to an embodiment of the present invention.

As shown in FIG. 5, the central processing unit 1 first searches the map block of a unit in a flash memory 2 and judges if there is a spare block in the unit (S21). If there is no spare block in the unit, the central processing unit 1 executes a retrieve operation with respect to the unit (S22).

Further, the central processing unit 1 searches the map block of the retrieved unit and judges if there is a spare block in the retrieved unit (S23). If there is a spare block in the unit as the judgement result in the step S21 or if there is a spare block in the retrieved unit as the judgement result in the step S23, the central processing unit 1 writes a logical block number (LBN) and a state of a data block in the map block (S24) and executes an error process if there is no spare block in the retrieved unit (S25).

At this time, the number of data blocks allocatable to the unit is maintained to be less than the maximum number of blocks recordable to the unit.

For example, if the maximum number of recordable blocks in a unit is ten, only seven blocks are actually allocated in the unit.

The remaining three empty spaces are retained as spare blocks to be used when the existing blocks are updated or rewritten after deleting.

A ratio of spare blocks with respect to data blocks may be determined according to an application requirement of a flash memory. The ratio of spare blocks in a unit in which frequent update operations are executed is increased in order to lower the frequency of update operation executions, so that an operation execution speed is entirely enhanced.

Further, spare blocks are not separately put aside in a read operation-dedicated unit, so that a space use rate is increased.

D. Read Operation

FIG. 6 is a flow chart for showing a read operation controlled by a method for controlling a flash memory according to an embodiment of the present invention.

Referring to a read operation with reference to FIG. 3 and FIG. 6, the central processing unit 1 first searches a logical unit number (LUN) and a physical unit number (PUN) to which a corresponding data block belongs by the mixed mapping technique and determines a physical location of the corresponding data block through the map block of a corresponding physical unit (S31).

At this time, the central processing unit 1 judges whether the corresponding data block exists in the unit (S32), reads data from the corresponding data block if the corresponding data block (S33) exists, and executes an error process the corresponding data block (S34) does not exist.

In the case of an updated block, a block location may be determined by searching for a location of the updated block in the map block.

E. Delete Operation

FIG. 7 is a flow chart for showing a delete operation controlled by a method for controlling a flash memory according to an embodiment of the present invention.

As shown in FIG. 7, the central processing unit 1 first searches a logical unit number (LUN) and a physical unit number (PUN) to which a corresponding data block belongs by the mixed mapping technique and determines a physical location of the corresponding data block through the map block of a corresponding physical unit (S41). Then the central processing unit 1 updates a state of the corresponding data block recorded in the map block of the unit to "deleting" (S42).

That is, when deleting data of a block, the central processing unit 1 updates only information of a block state without deleting a unit to which the block belongs.

F. Update Operation

Figure 12:
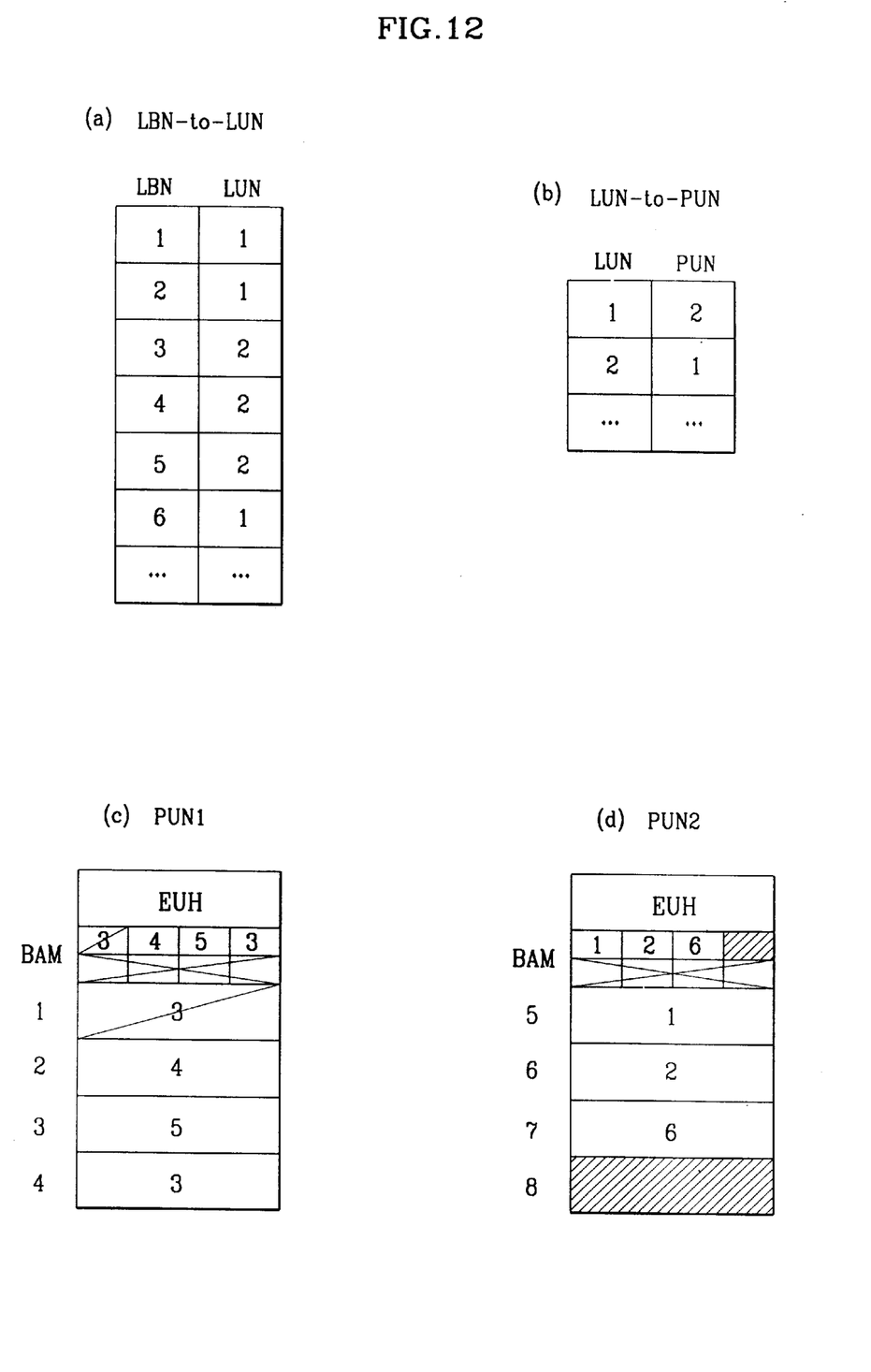
FIGS. 12(A)–(D) are a set of views for explaining an update operation of FIG. 8, wherein (A) is a view for showing a structure of an LBN-to-LUN map table, (B) is a view for showing a structure of an LUN-to-PUN map table, and (C) and (D) are views for showing a structure of units in a flash memory.

FIG. 8 is a flow chart for showing an update operation controlled by a method for controlling a flash memory according to an embodiment of the present invention, and FIG. 12 is a set of views for explaining an update operation of FIG. 8, wherein (A) is a view for showing a structure of an LBN-to-LUN map table, (B) is a view for showing a structure of an LUN-to-PUN map table, and (C) and (D) are views for showing a structure of units in a flash memory.

Referring to a update operation with reference to FIG. 8 and FIG. 12, the central processing unit 1 first searches a logical unit number (LUN) and a physical unit number (PUN) to which a corresponding data block belongs by the mixed mapping technique and determines a physical location of the corresponding data block through the map block of a corresponding physical unit (S51).

The central processing unit 1 judges whether the corresponding data block exists in the physical unit (S52), searches the map block if the corresponding data block exists, and judges if a state of the corresponding data block is "allocated" (S53).

If the state of the corresponding data block is "allocated" as the judgement result in the step S53, the central processing unit 1 updates the state of the corresponding data block to "writing" (S54), writes data to the corresponding data block (S55), and updates the state of the corresponding data block to "written" (S56).

If the state of the corresponding data block is not "allocated" as the judgement result in the step S53, the central processing unit 1 updates the state of the corresponding data block to "deleting" (S57) and searches and then allocates a spare block in the unit (S58). Thereafter, the central processing unit 1 updates a state of the newly allocated block to "writing" (S59), writes location information of the newly allocated block in the map block (S60), write the data into the newly allocated block (S61), updates the state of the newly allocated block to "written" (S62), and updates the state of the corresponding data block to "deleted" (S63).

At this time, if the corresponding data block does not exist as the judgement result in the step S52, the central processing unit 1 executes an error process (S64).

That is, when updating data of a block, if there is a spare block in a unit, the central processing unit 1 writes new data in the spare block, updates mapping information, and updates a state of a previous block.

For example, as shown in FIG. 12(C), in the case of updating data of a block 1, the central processing unit 1 allocates a spare block as a new block 4 and writes new data in the new block 4, so that no further spare block exists in a physical unit (PUN1). At this time, the central processing unit 1 leaves data of a previous block 1 untouched and marks only state information of the block 1 as "deleted".

G. Retrieve Operation

If a block allocated in a unit is frequently updated or deleted, spare blocks are reduced so that no further update and delete operations may be executed.

A block can be moved to a different unit in the case of the arbitrary mapping, but a logical unit to which a block is allocated is constant in the case of the present invention, so that a spare block is secured again by deleting the unit.

That is, a valid block in a retrieve unit is transferred to a move unit and a previous unit is deleted to be reset to a reusable state.

At this time, after the transfer, the deleted unit becomes a move unit.

At least one or more move units exist continuously in a flash memory device, and, in case of size-different units, there should be at least one move unit of each size.

For example, if a flash memory has a 8 KB unit and a 64 KB unit, there should exist one or more 8 KB move units together with one or more 64 KB move units.

A data transfer or a move occurs only between units each having the same size.

Accordingly, after a data transfer, a logical unit number (LUN) is not updated in the BN-to-LUN map table and only a physical unit number (PUN) is updated in the LUN-to-PUN map table.

If a move is needed between size-different units, a separate storage space is required for the BN-to-LUN mapping, and storage space and processing time are required for maintaining a bucket boundary inside a unit as well.

In the method of the present invention, a logical block is mapped into a constant logical unit. Therefore, in the case in which a particular block is frequently updated, the number of delete times of a logical unit to which the block belongs may be rapidly increased.

Such disadvantage is covered by using a file factor and a wear and tear degree leveling method.

That is, a bucket size is maintained to be less than a unit size, so that a move may not be carried out until update operations occur to an extent.

However, even though doing so, the number of delete times of two units may be intensively increased.

Accordingly, the number of delete times is recorded in the header block and, if the number is larger than a predetermined value, data is exchanged with a different unit having a lower number of delete times.

FIG. 9 is a flow chart for showing a retrieve operation controlled by a method for controlling a flash memory according to an embodiment of the present invention, and FIG. 13 is a set of views for explaining a retrieve operation of FIG. 9, wherein (A) is a view for showing a structure of an LBN-to-LUN map table, (B) is a view for showing a structure of an LUN-to-PUN map table, and (C), (D), and (E) are views for showing a structure of units in a flash memory.

Referring to an retrieve operation according to an embodiment of the present invention with reference to FIG. 9 and FIG. 13, the central processing unit 1 first determines a retrieve unit (EU) and a move unit (TU)(S71), reads the number of delete times recorded in the header block of the move unit (TU), and judges if the number of delete times is beyond a critical value (S72).

If the number of delete times of the move unit (TU) is beyond the critical value as the judgement result in the step S72, the central processing unit 1 selects a move unit (TU) having the lowest number of delete times (S73).

If a move unit (TU) having a number of delete times less than or equal to the critical value in the step S72 is selected or a move unit (TU) having the lowest number of delete times in the step S73 is selected, the central processing unit 1 updates a state of the retrieve unit to "moving" (S74), and updates a state of the move unit (TU) having the number of deleted items less than or equal to the critical value or a state of the move unit (TU) having the lowest number of delete times to "copying" (S75).

The central processing unit 1 copies blocks of "writing" and "written" states, map block items, and the number of delete times from the retrieve unit (EU) to the move unit (TU)(S76), updates a state of the move unit (TU) to "valid" (S77), and deletes the retrieve unit (EU)(S78).

After the processes are finished, the central processing unit 1 reads and increases the number of delete times copied in the header block of the move unit (TU), writes the number of delete times into the header block of the deleted unit (S79), and updates a structure of materials such as mapping information and the like inside a flash memory (S80).

At this time, the central processing unit 1 separately records in a RAM 3 the number of a move unit (TU) having the number of delete times greater than the critical value as the judgement result in the step S72, and then, if a retrieve operation is ended, reads the move unit (TU) number recorded in the RAM 3, and executes the retrieve operation with respect to the move unit.

Figure 13A:
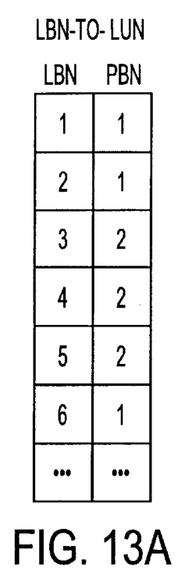
FIGS. 13(A)–(E) are a set of views for explaining a retrieve operation of FIG. 9, wherein (A) is a view for showing a structure of an LBN-to-LUN map table, (B) is a view for showing a structure of an LUN-to-PUN map table, and (C), (D), and (E) are views for showing a structure of units in a flash memory.
Figure 13B:
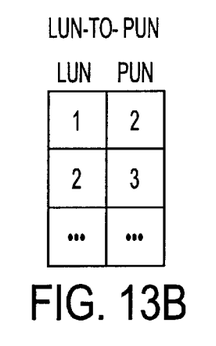
Figure 13C:
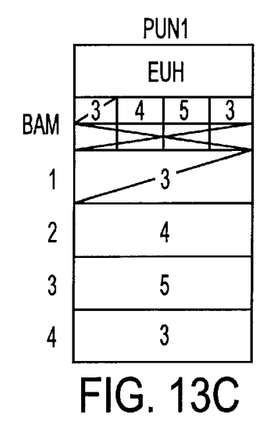
Figure 13D:
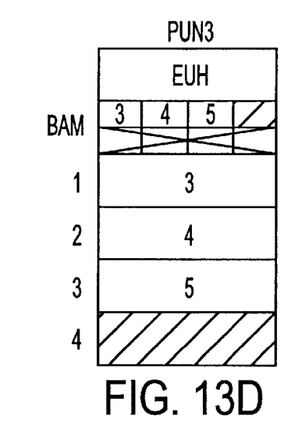
Figure 13E:
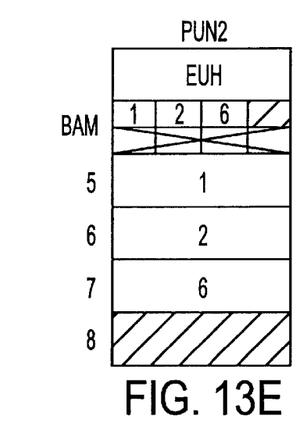

For example, as shown in FIGS. 13(C) and (D), if a spare block does not exist in a unit having a physical unit number of 1, the central processing unit 1 executes a retrieve operation, transfers valid blocks from a retrieve unit to a move unit having a physical unit number of 3, deletes all data in the unit having the physical unit number of 1, and secures a spare block.

During the retrieve operation execution, the central processing unit 1 can determine whether or not the retrieve is carried out according to the number of delete times by reading the number of delete times from the header block of the move unit, but can maintain as a translation variable whether or not the retrieve is carried out by determining whether or not the retrieve is carried out when initializing a system.

Further, the central processing unit 1 should search a wear and tear degree order for leveling wear and tear. For the leveling of the wear and tear, the central processing unit 1 constitutes a structure of materials in a queue inside a memory.

Further, the central processing unit 1 can set a state of the block or the unit in advance to be suitable for the property of a flash memory and the order of an algorithm.

For example, since the state of a block progresses in the order of undefined (FF)→allocated (8F)→writing (4F)→written (2F)→deleting (0F)→deleted (00) for read, write, delete, and update operations and the state of a unit progresses in the order of undefined (FF) →copying (8F) →valid (4F)→moving (2F) for a retrieve operation, the central processing unit 1 sets the state of a block or a unit in advance to be updated in the above order.

H. Error Restoration

FIG. 10 is a view for showing a state of a restore operation controlled by a method for controlling a flash memory according to an embodiment of the present invention when an error occurs while performing an update operation of FIG. 8, and FIG. 11 is a view for showing a state of a restore operation controlled by a method for controlling a flash memory according to an embodiment of the present invention when an error occurs while performing a retrieve operation of FIG. 9.

That is, FIG. 10 shows a flow indicating that state information of a previous block X_old and a new block X_new is updated with time when updating a block.

The bold downward arrows indicate time axes, the values in the rectangular boxes each indicate the states of blocks at a corresponding time, and the horizontal lines indicate a failure-occurring time.

The bent arrows and the labels in the left and right of the drawings indicate operations to be executed in a restore step and states to which the blocks return after the restoration.

Accordingly, while deleting data of a data block X_old, a) if an error occurs in a state in which a spare block X_new is not allocated, the method of the present invention allocates a spare block Y_new in the same unit and writes the deleting data to the allocated spare block Y_new from the data block X_old, b) if an error occurs in a state in which a spare block X_new is allocated, the method of the present invention writes the deleting data to the allocated spare block X_new from the data block X_old, and c) if an error occurs in a state in which updated data is being written to the spare block X_new, the method of the present invention deletes the updated data written in the spare block X_new, reallocates a spare block Z_new in the same unit, and writes the deleting data to the reallocated spare block Z_new from the data block X_old, to thereby control a restore operation when an error occurs.

For example, if a failure occurs when the state of the data block X_old is "deleting" and the state of the spare block X_new is "allocated", data being deleted from the data block X_old is written into the allocated spare block X_new when restarting and then the remaining processes continue.

The values which the state of a block may have are all expressed in the state view of FIG. 10, and a restoration can be made according to the order of the state view even though a failure occurs again while a restoration process is carried out.

FIG. 13 is a view for showing state changes of a retrieve unit (EU) and an empty unit (TU) when retrieving a unit.

Accordingly, while transferring data of a retrieve unit (EU), a) if an error occurs in a state in which the data is not being copied to a move unit (TU), the method of the present invention re-executes a retrieve operation of the retrieve unit (EU), and b) if an error occurs in a state in which the data is being copied to the move unit (TU), the method of the present invention deletes the data copied into the move unit (TU) and re-executes the retrieve operation of the retrieve unit (EU), to thereby control a restore operation when an error occurs.

For example, if a failure occurs when the state of a retrieve unit (EU) is "transferring" and the state of a move unit (TU) is "copying", data copied into the move unit is deleted when restarting and then a retrieve operation is carried out with respect to the retrieve unit (EU) again.

Accordingly, only the state in which a retrieve operation is completely carried out or not carried out at all exists.

As stated above, in the case of updating data of a data block, the present invention first writes update data into an empty spare block in the same unit, updates mapping information of the map block, and updates state information of a previous block, so that a user can have access to data by using the same address and there is no need to delete a unit every time the block is updated. Therefore, the present invention enhances an efficiency of writing and updating data while reducing the number of delete times. Further, even though an error occurs during the use of a flash memory, the restoration is easily made and the arbitrariness of a mapping is reduced, thereby solving the problem of intensive delete operations which may occur.

Although the preferred embodiment of the present invention has been described, it will be understood by those skilled in the art that the present invention should not be limited to the described preferred embodiment, but various changes to the scope of the present invention as defined by the appended claims are possible.

What is claimed is:

1. A method for controlling a flash memory having units wherein each of the units includes a plurality of data blocks for writing data, a plurality of spare blocks emptied for writing updated data of the data blocks, a map block for designating an actual location in which data is written with respect to a logical block number, and a header block for recording flash memory information and unit information, the method comprising steps of:

controlling a mapping operation for mapping the data blocks within the flash memory, by using the map block to correlate the logical block number to the actual location in which data is written;

controlling an allocate operation for allocating the data blocks among the units;

controlling a read operation for reading the data in the data blocks;

controlling a delete operation for designating a data block as "deleted";

controlling an update operation for updating data of the data block;

controlling a retrieve operation for restoring the unit to a reusable condition; and controlling a restore operation for restoring normal controlling operations of the flash memory after an error occurs.

2. The method as claimed in claim 1, wherein the mapping operation controlling step includes steps of:

searching a logical unit to which a logical block belongs;

searching a physical unit with respect to the logical unit; and searching a physical block location with respect to the logical block in the map block of the physical unit.

3. The method for controlling a flash memory as claimed in claim 1, wherein the unit is used as a basic unit of a delete operation.

4. The method for controlling a flash memory as claimed in claim 1, wherein a logical unit number, a wear and tear degree, and block size information are recorded in the header blocks.

5. The method for controlling a flash memory as claimed in claim 1, wherein the logical block number, block state information, and updated block location information are recorded in the map block.

6. The method as claimed in claim 1, wherein the delete operation controlling step includes steps of:

searching a unit to which a corresponding data block belongs; and updating a state of the corresponding data block written in the map block of the unit, wherein the delete operation controlling step is accomplished without deleting the data of the entire unit.

7. A method for controlling a flash memory having units wherein each of the units includes a plurality of data blocks for writing data, a plurality of spare blocks emptied for writing updated data of the data blocks, a map block for designating an actual location in which data is written, and a header block for recording flash memory information and unit information, the method comprising steps of:

controlling a mapping operation for mapping the data blocks within the flash memory;

controlling an allocate operation for allocating the data blocks among the units;

controlling a read operation for reading the data in the data blocks;

controlling a delete operation for designating a data block as "deleted";

controlling an update operation for updating data of the data block;

controlling a retrieve operation for restoring the unit to a reusable condition; and controlling a restore operation for restoring normal controlling operations of the flash memory after an error occurs, wherein the allocate operation controlling step includes steps of:
  a) checking the map block of the unit to judge if there is a spare block in the unit;
  b) performing a retrieve operation with respect to the unit if there is no spare block in the unit as a judgement result of step a);
  c) checking the map block of a retrieved unit to judge if there is a spare block in the retrieved unit;
  d) writing a logical block number and a state of a data block into the map block if step a) judges that the spare block exists in the unit or if step c) judges that the spare block exists in the retrieved unit; and
  e) performing an error process if step c) judges that no spare block exists in the retrieved unit.

8. A method for controlling a flash memory having units wherein each of the units includes a plurality of data blocks for writing data, a plurality of spare blocks emptied for writing updated data of the data blocks, a map block for designating an actual location in which data is written, and a header block for recording flash memory information and unit information, the method comprising steps of:

controlling a mapping operation for mapping the data blocks within the flash memory;

controlling an allocate operation for allocating the data blocks among the units;

controlling a read operation for reading the data in the data blocks;

controlling a delete operation for designating a data block as "deleted";

controlling an update operation for updating data of the data block;

controlling a retrieve operation for restoring the unit to a reusable condition; and controlling a restore operation for restoring normal controlling operations of the flash memory after an error occurs, wherein the read operation controlling step includes steps of:
  a) searching a unit to which a corresponding data block belongs,
  b) judging if the corresponding data block exists in the unit;
  c) reading data in the corresponding data block if step b) judges that the corresponding data block exists in the unit; and
  d) carrying out an error process if step b) judges that the corresponding data block does not exist in the unit.

9. A method for controlling a flash memory having units wherein each of the units includes a plurality of data blocks for writing data, a plurality of spare blocks emptied for writing updated data of the data blocks, a map block for designating an actual location in which data is written, and a header block for recording flash memory information and unit information, the method comprising steps of:

controlling a mapping operation for mapping the data blocks within the flash memory;

controlling an allocate operation for allocating the data blocks among the units;

controlling a read operation for reading the data in the data blocks;

controlling a delete operation for designating a data block as "deleted";

controlling an update operation for updating data of the data block;

controlling a retrieve operation for restoring the unit to a reusable condition; and controlling a restore operation for restoring normal controlling operations of the flash memory after an error occurs, wherein the update operation controlling step includes steps of:
  a) determining a unit to which a corresponding data block belongs;
  b) judging if the corresponding data block exists in the unit;
  c) searching a map block and judging if a state of the corresponding data block is "allocated" if step b) judges that the corresponding data block exists in the unit;
  d) if step c) judges that the corresponding data block is "allocated", then the method includes the sub-steps of:
    1) updating the state of the corresponding data block to "writing";
    2) storing data in the corresponding data block; and
    3) updating the state of the corresponding data block to "written";
  e) if step c) judges that the corresponding data block is not "allocated", then the method includes the steps of;
    1) updating the corresponding data block to "deleting";
    2) searching a spare block in the unit to be allocated;
    3) updating a state of a newly allocated block to "writing";
    4) storing position information of the newly allocated block in the map block;
    5) storing data in the newly allocated block;
    6) updating the state of the newly allocated block to "written"; and
    7) updating the state of the corresponding data block to "deleted"; and
  f) carrying out an error process if step b) judges that the corresponding data block does not exist in the unit.

10. A method for controlling a flash memory having units wherein each of the units includes a plurality of data blocks for writing data, a plurality of spare blocks emptied for writing updated data of the data blocks, a map block for designating an actual location in which data is written, and a header block for recording flash memory information and unit information, the method comprising steps of:

controlling a mapping operation for mapping the data blocks within the flash memory;

controlling an allocate operation for allocating the data blocks among the units;

controlling a read operation for reading the data in the data blocks;

controlling a delete operation for designating a data block as "deleted";

controlling an update operation for updating data of the data block;

controlling a retrieve operation for restoring the unit to a reusable condition; and controlling a restore operation for restoring normal controlling operations of the flash memory after an error occurs, wherein the retrieve operation controlling step includes steps of:
- a) determining a retrieve unit and a move unit;
- b) judging if a number of deletions of the move unit is beyond a critical value;
- c) selecting a move unit having a lowest number of deletions if the number of deletions of the move unit is beyond the critical value as judged by step b);
- d) updating a state of the retrieve unit to "moving" if the number of deletions of the move unit is not beyond the critical value as judged by step b), or if the move unit having the lowest number of deletions is selected in step c);
- e) updating a state of either the move unit having the number of deletions not beyond the critical value or the move unit having the lowest number of deletions as selected in step c) to "copying";
- f) copying blocks and map block items in the states of "writing" and "written" and the number of deletions from the retrieve unit into the move unit;
- g) updating a state of the move unit to "valid";
- h) deleting the retrieve unit;
- i) reading and increasing the number of deletions of the retrieve unit copied into the move unit and then writing the number of deletions into the retrieve unit which is now deleted; and
- j) updating a structure of materials including mapping information inside the flash memory.

11. A method for controlling a flash memory having units wherein each of the units includes a plurality of data blocks for writing data, a plurality of spare blocks emptied for writing updated data of the data blocks, a map block for designating an actual location in which data is written, and a header block for recording flash memory information and unit information, the method comprising steps of:

controlling a mapping operation for mapping the data blocks within the flash memory;

controlling an allocate operation for allocating the data blocks among the units;

controlling a read operation for reading the data in the data blocks;

controlling a delete operation for designating a data block as "deleted";

controlling an update operation for updating data of the data block;

controlling a retrieve operation for restoring the unit to a reusable condition; and controlling a restore operation for restoring normal controlling operations of the flash memory after an error occurs, wherein the restore operation controlling step, while deleting data of a data block, includes steps of:
- a) if an error occurs while a first spare block is not "allocated", allocating a second spare block in the same unit and writing the deleted data to the allocated second spare block from the data block;
- b) if an error occurs while the first spare block is "allocated", writing the deleted data to the allocated first spare block from the data block; and
- c) if an error occurs while updated data is being written to the first spare block, deleting the updated data written in the first spare block, reallocating a third spare block in the same unit, and writing the deleted data to the reallocated third spare block from the data block.

12. A method for controlling a flash memory having units wherein each of the units includes a plurality of data blocks for writing data, a plurality of spare blocks emptied for writing updated data of the data blocks, a map block for designating an actual location in which data is written, and a header block for recording flash memory information and unit information, the method comprising steps of:

controlling a mapping operation for mapping the data blocks within the flash memory;

controlling an allocate operation for allocating the data blocks among the units;

controlling a read operation for reading the data in the data blocks;

controlling a delete operation for designating a data block as "deleted";

controlling an update operation for updating data of the data block;

controlling a retrieve operation for restoring the unit to a reusable condition; and controlling a restore operation for restoring normal controlling operations of the flash memory after an error occurs, wherein the restore operation controlling step, while transferring data of a retrieve unit, includes steps of:
- a) re-executing a retrieve operation of the retrieve unit if an error occurs while the data is not being copied to a move unit; and
- b) deleting the data copied to the move unit and re-executing the retrieve operation of the retrieve unit if an error occurs while the data is being copied to the move unit.

13. An apparatus for controlling a flash memory having units wherein each of the units includes a plurality of data blocks for writing data, a plurality of spare blocks emptied for writing updated data of the data blocks, a map block for designating an actual location in which data is written with respect to a logical block number, and a header block for recording flash memory information and unit information, the apparatus comprising:

means for controlling a mapping operation for mapping the data blocks within the flash memory, by using the map block to correlate the logical block number to the actual location in which data is written;

means for controlling an allocate operation for allocating the data blocks among the units;

means for controlling a read operation for reading the data in the data blocks;

means for controlling a delete operation for designating a data block as "deleted";

means for controlling an update operation for updating data of the data block;

means for controlling a retrieve operation for restoring the unit to a reusable condition; and means for controlling a restore operation for restoring normal controlling operations of the flash memory after an error occurs.

* * * * *